(12) United States Patent
Doring et al.

(10) Patent No.: US 10,862,224 B2
(45) Date of Patent: Dec. 8, 2020

(54) SPLICE SEALING DEVICE

(71) Applicant: YAZAKI EUROPE LTD., Hertfordshire (GB)

(72) Inventors: Andreas Doring, Spessart (DE); Taiga Fukushima, Leichlingen (DE); Oliver Kocsis-Steinacker, Leverkusen (DE); Antonio Perez-Jimenez, Cologne (DE); Julian Peters, Leverkusen (DE); Christoph Wilhelm Roth, Engelskirchen (DE)

(73) Assignee: YAZAKI EUROPE LTD., Hertfordshire (GB)

( * ) Notice: Subject to any disclaimer, the term of this patent is extended or adjusted under 35 U.S.C. 154(b) by 0 days.

(21) Appl. No.: 16/806,364

(22) Filed: Mar. 2, 2020

(65) Prior Publication Data

US 2020/0303841 A1    Sep. 24, 2020

(30) Foreign Application Priority Data

Mar. 18, 2019 (EP) .................................. 19163578

(51) Int. Cl.
*H02G 3/06* (2006.01)
*H05K 9/00* (2006.01)
*H01R 4/10* (2006.01)
*H01R 4/70* (2006.01)
*H02G 15/08* (2006.01)

(52) U.S. Cl.
CPC ................. *H01R 4/10* (2013.01); *H01R 4/70* (2013.01); *H02G 3/0666* (2013.01); *H02G 15/08* (2013.01); *H05K 9/0098* (2013.01)

(58) Field of Classification Search
CPC .......................... H02G 3/0666; H05K 9/0098
See application file for complete search history.

(56) References Cited

U.S. PATENT DOCUMENTS

| 4,110,550 A |   | 8/1978 | Di Pietro |
|---|---|---|---|
| 4,533,197 A | * | 8/1985 | Prince .................... H01R 9/032 439/404 |

(Continued)

FOREIGN PATENT DOCUMENTS

GB            910966 A        11/1962

OTHER PUBLICATIONS

Extended European Search Report for 19163578.8, dated Sep. 16, 2019.

*Primary Examiner* — Hung V Ngo
(74) *Attorney, Agent, or Firm* — Sughrue Mion, PLLC

(57) ABSTRACT

A splice sealing device including a first electric cable having an electrical conductor and an insulative cover, a second electric cable having a further electrical conductor and insulative cover, a junction joining the electrical conductors of the first and second electrical cables, a housing which has at least two housing parts mated to each other and which delimits an inner space for accommodating the junction, and a first cable exit in the housing. The first cable extends through the first cable exit, which includes a first chamber accommodating a first cable seal positioned on the first insulative cover of the first cable and sealing the first cable against the housing. The first cable exit is an integral part of a first housing part, and the first cable exit includes an annular wall axially delimiting the first chamber to the outside in extension direction of the first cable.

8 Claims, 5 Drawing Sheets

(56) References Cited

U.S. PATENT DOCUMENTS

| | | | | |
|---|---|---|---|---|
| 4,879,807 A | * | 11/1989 | Roucaute | H01R 4/72 |
| | | | | 29/828 |
| 5,044,978 A | * | 9/1991 | Gelin | H01R 9/0509 |
| | | | | 439/394 |
| 5,306,870 A | * | 4/1994 | Abat | H01R 9/0506 |
| | | | | 174/659 |
| 7,658,647 B2 | * | 2/2010 | Reker | H01R 13/6658 |
| | | | | 439/607.41 |
| 9,660,434 B2 | | 5/2017 | Kett et al. | |
| 2015/0114711 A1 | * | 4/2015 | Dew | H01B 7/0045 |
| | | | | 174/72 A |

* cited by examiner

SPLICE SEALING DEVICE

TECHNICAL FIELD

The present disclosure relates to a splice sealing device comprising an electric cable having an electrical conductor, a second electric cable having a further electrical conductor, and a junction joining the electrical conductor of the first electrical cable and the electrical conductor of the second electrical cable, wherein a housing accommodates the junction.

BACKGROUND

U.S. Pat. No. 9,660,434 B2 discloses a splice sealing device with a housing which is split into two half shells along a separation plane. The housing is only open at housing feed-through sockets. The housing is split such that also the feed-through sockets are split. Thus, each feed-through socket is formed by the two half shells. Through each of the feed-through sockets a cable extends. Each feed-through socket accommodates a cable seal which is positioned on the respective cable and which is in sealing contact with a sealing face of the respective feed-through socket. The cable seal is pushed from the outside into the feed through socket and is held by a clip in the socket. The clip is mounted from the outside onto the housing, wherein the clip has a passage opening through which the cable extends.

Splice sealing devices are generally used where two or more cables, each having a conductor and an insulative cover enclosing the conductor, are electrically connected. The cables may have multiple wires inside of the insulative cover. Each wire has a wire insulation covering the conductor. It is also possible that a cable is used which has one conductor and the insulative cover is the insulation covering the conductor. For the electrical connection the insulation of the wires is removed from the conductors at the wire ends so that the conductors can be joined. Hence, the junction of the joined conductor ends is not insulated and needs to be sealed. Such connections are not only used in splice assemblies, in which two wires are connected, but also in splitter assemblies or splice devices in wire harnesses used to split a single electrical conduit or cable into multiple electrical cables or combine multiple electrical cables into a single electrical cable. Often, these splitter assemblies come in the form of junction blocks that are capable of splitting two cables into a plurality of cables. Junction blocks contain a large number of parts and thus can require complicated assembly processes and can be very expensive. Further, junction boxes are relatively bulky and occupy significant space. An Example of a splice device is disclosed in EP 3 073 585 B1.

SUMMARY

It may therefore be beneficial to provide a splice sealing device with reduced complexity and reduced number of parts.

Various embodiments of the present disclosure are directed to a splice sealing device comprising a first electric cable having at least one electrical conductor and an insulative cover enclosing the electrical conductor of the first electric cable, and a second electric cable having at least one further electrical conductor and a further insulative cover enclosing the electrical conductor of the second electric cable. The spice sealing device further has a junction joining the electrical conductor of the first electrical cable and the electrical conductor of the second electrical cable. A housing which has at least two housing parts mated to each other and which delimits an inner space for accommodating the junction. The housing has a first cable exit wherein the first cable extends through the first cable exit, wherein the first cable exit comprises a first chamber accommodating a first cable seal sealingly positioned on the insulative cover of the first cable and sealing the first cable against the housing. The first cable exit is an integral part of a first housing part of the at least two housing parts, and the first cable exit comprises an annular wall axially delimiting the first chamber to the outside in extension direction of the first cable.

It is beneficial to these embodiments that the first chamber for accommodating the first cable seal is arranged in the first cable exit which is an integral part of the first housing part. Hence, the first chamber for accommodating the first cable seal is not split and, therefore, has no parting line which might affect sealing properties. In addition, the first chamber is axially delimited to the outside by an annular wall which is part of the integral housing part. No separate clip is necessary to delimited the first chamber to the outside. Further, the first cable seal can be axially supported by the annular wall within the first chamber.

The assembly of the splice sealing device may be accomplished by sliding the first housing part onto the first cable from the free end of the cable and afterwards sliding the first cable seal onto the first cable from the same side of the cable. It is, however, also possible to mount the seal and the housing part from the other end of the cable in reversed order.

The same may be done with the second housing part which is slid onto the second cable. After the conductors of the first cables and the second cable are connected the housing parts are slid towards each other. Thereby the first cable seal is moved into the first chamber and comes into contact to the annular wall of the first cable exit. Eventually, the first cable seal is moved by the annual wall of the first cable exit to its final position on the first cable. Finally the housing parts are mated and connected to each other.

It is not necessary to use a clip to close the first chamber and to hold the first cable seal. Further, the housing is not split in the area of the first chamber so that the sealing effect is enhanced and not diminished by a parting line between the housing parts. In addition, during the assembly of the housing parts the first cable seals is automatically moved into the first chamber and is moved by the annular wall of the first cable exit to its final position. The first cable seal has not to be manipulated in a separate step.

The first chamber may have a circumferential sealing face, wherein the first cable seal is in sealing contact to said sealing face.

The first cable exit may have a first sleeve portion which is mounted onto the insulative cover of the first cable. Thus, the first sleeve portion is an integral part of the first housing part. A passage channel can extend through the first sleeve portion leading the first cable from the inner space of the housing to the outside. The integration of the first sleeve portion to the housing further reduces the number of parts.

The passage channel may extend through the annular wall of the first cable exit and may open into the first chamber.

The first sleeve portion may have clamping arms that extend in a direction away from the first chamber and that are distributed around the first cable. The clamping arms can be biased radially towards the first cable so that the clamping arms apply a force to the first cable for clamping the housing on the insulative cover of the first cable. In addition, a cable strap can be arranged around the first sleeve portion, in particular around the clamping arms, in order to increase the clamping effect of the first sleeve portion onto the insulative cover of the first cable.

The splice sealing device may further comprise a shielding case arranged within the housing and enclosing the junction. A first contact sleeve arrangement may be provided which is mounted on the insulative cover of the first cable. The first contact sleeve arrangement is in electrical contact to a shielding of the first cable and to the shielding case. The first contact sleeve arrangement delimits the first chamber in axial direction opposite the annular wall of the first cable exit. Hence, the first cable seal is securely fixed between the annular wall of the first cable exit and the flange portion of the first contact sleeve.

The first contact sleeve arrangement may comprise an inner sleeve positioned between the insulative cover of the first cable and the shielding of the first cable. The shielding case can comprise a contact portion positioned on the shielding of the first cable, wherein the first contact sleeve arrangement further comprises an outer sleeve positioned onto the contact portion of the shielding case.

The housing may have a second cable exit which is an integral part of a second housing part of the at least two housing parts. The second cable extends through the second cable exit. The second cable exit comprises a second chamber accommodating a second cable seal sealingly positioned on the insulative cover of the second cable and sealing the second cable against the housing. The second cable exit comprises an annular wall axially delimiting the second chamber to the outside in extension direction of the second cable.

The housing may further have a third cable exit being an integral part of a second housing part of the at least two housing parts, wherein a third cable extends through the third cable exit. The third cable exit comprises the third chamber accommodating a third cable seal sealingly positioned on the insulative cover of the third cable and sealing the third cable against the housing. The third cable exit comprises an annular wall axially delimiting the third chamber to the outside in extension direction of the third cable.

It is also possible that one or more cable exits are provided in the first and/or the second housing part wherein all cable exits are substantially design in the same manner as the first cable exit.

Further areas of applicability and additional objects and advantages will become apparent from the description provided hereinafter. The description and specific examples are intended for purposes of illustration only and are not intended to limit the scope of the present disclosure.

DETAILED DESCRIPTION

Figure 1:
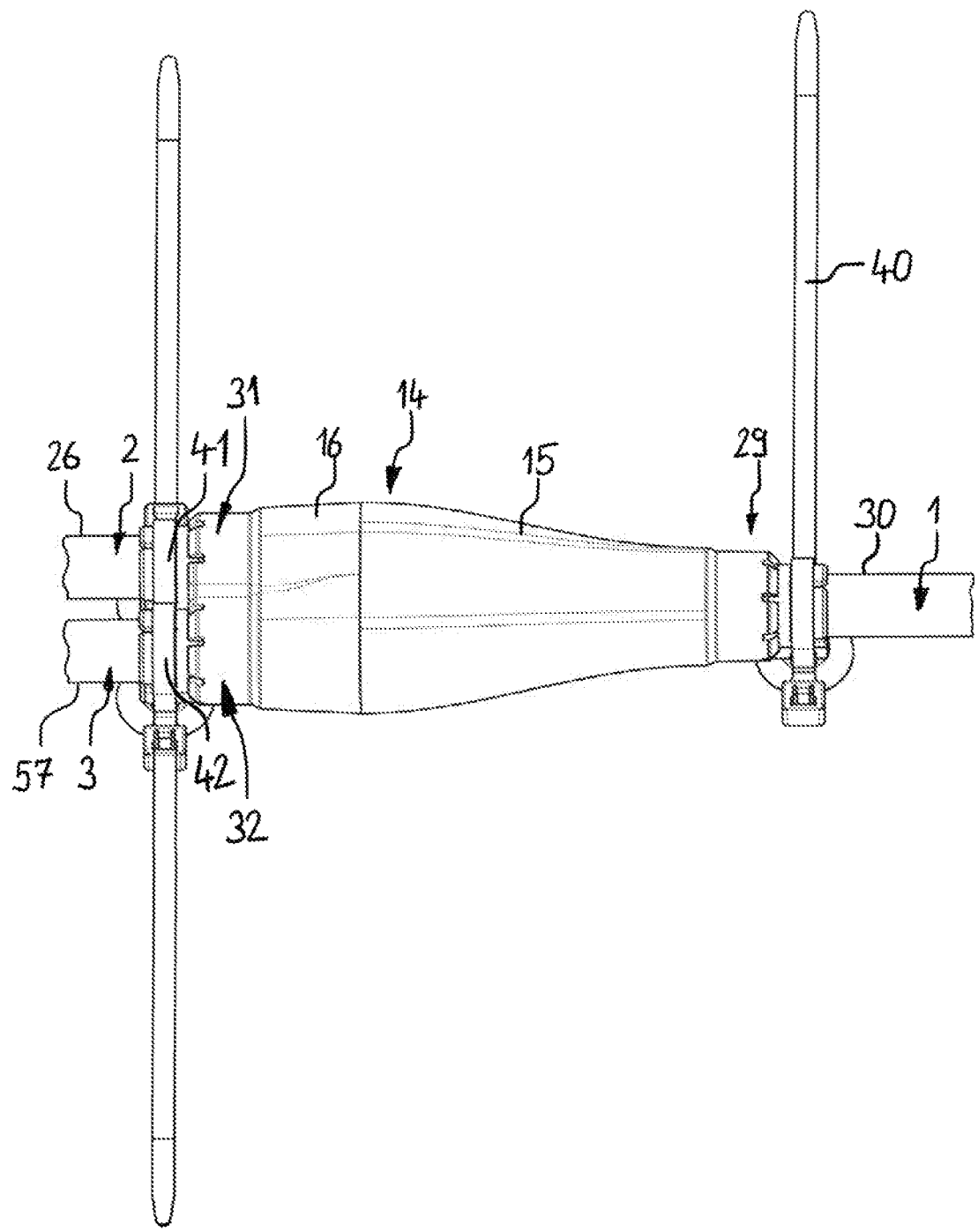
FIG. 1 is a perspective view of a splice sealing device.
Figure 2:
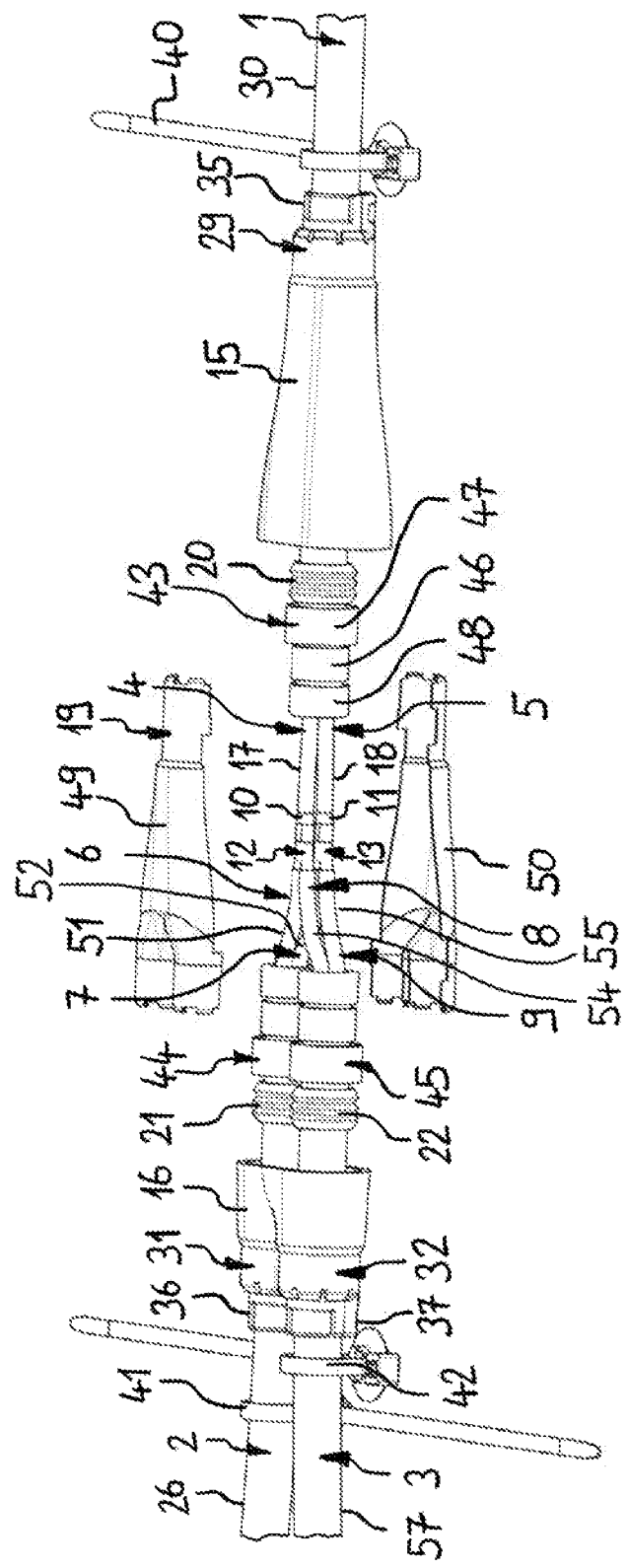
FIG. 2 is a perspective exploded representation of the splice sealing device according to FIG. 1.
Figure 3:
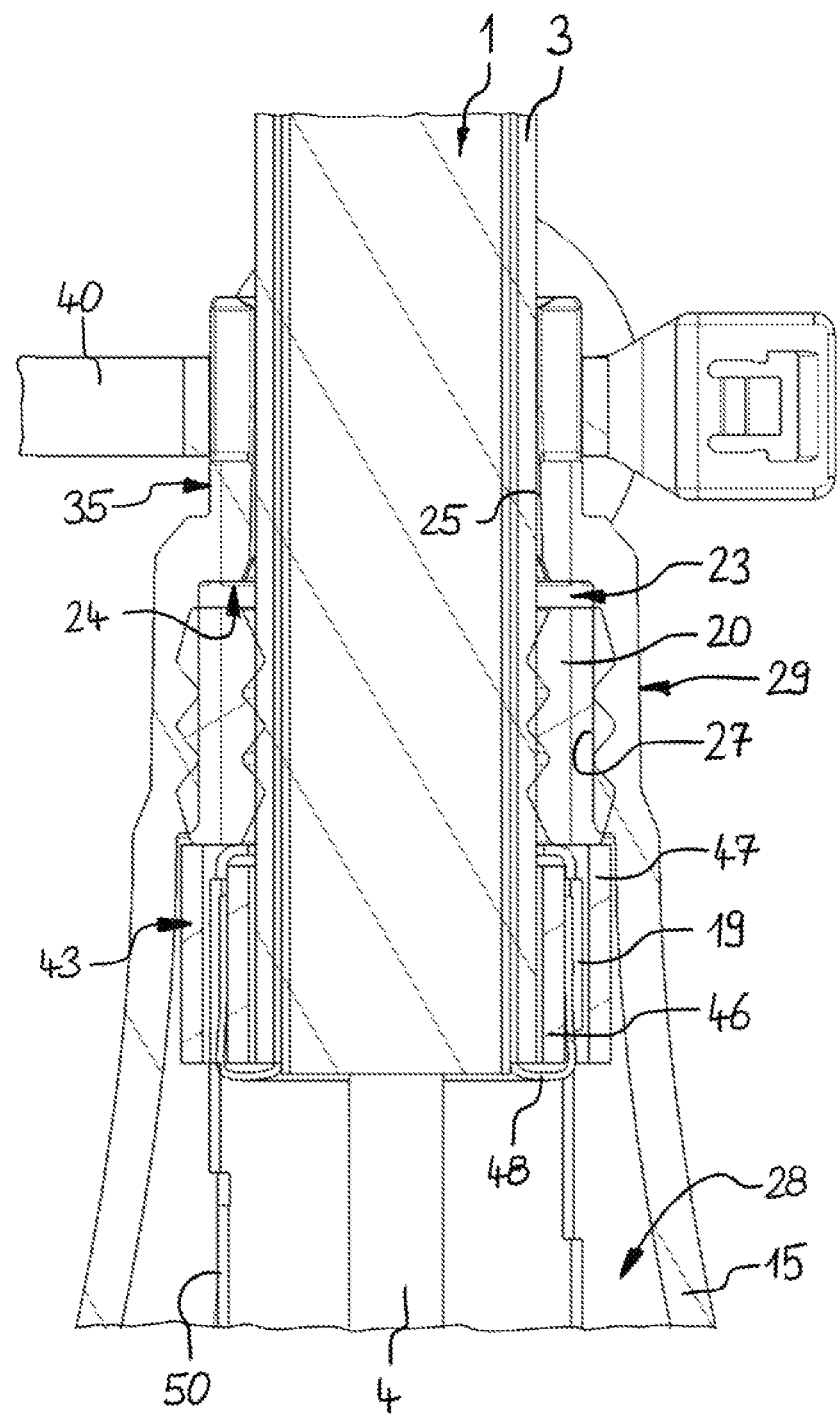
FIG. 3 is a longitudinal sectional side view of the splice sealing device according to FIG. 1.
Figure 4:
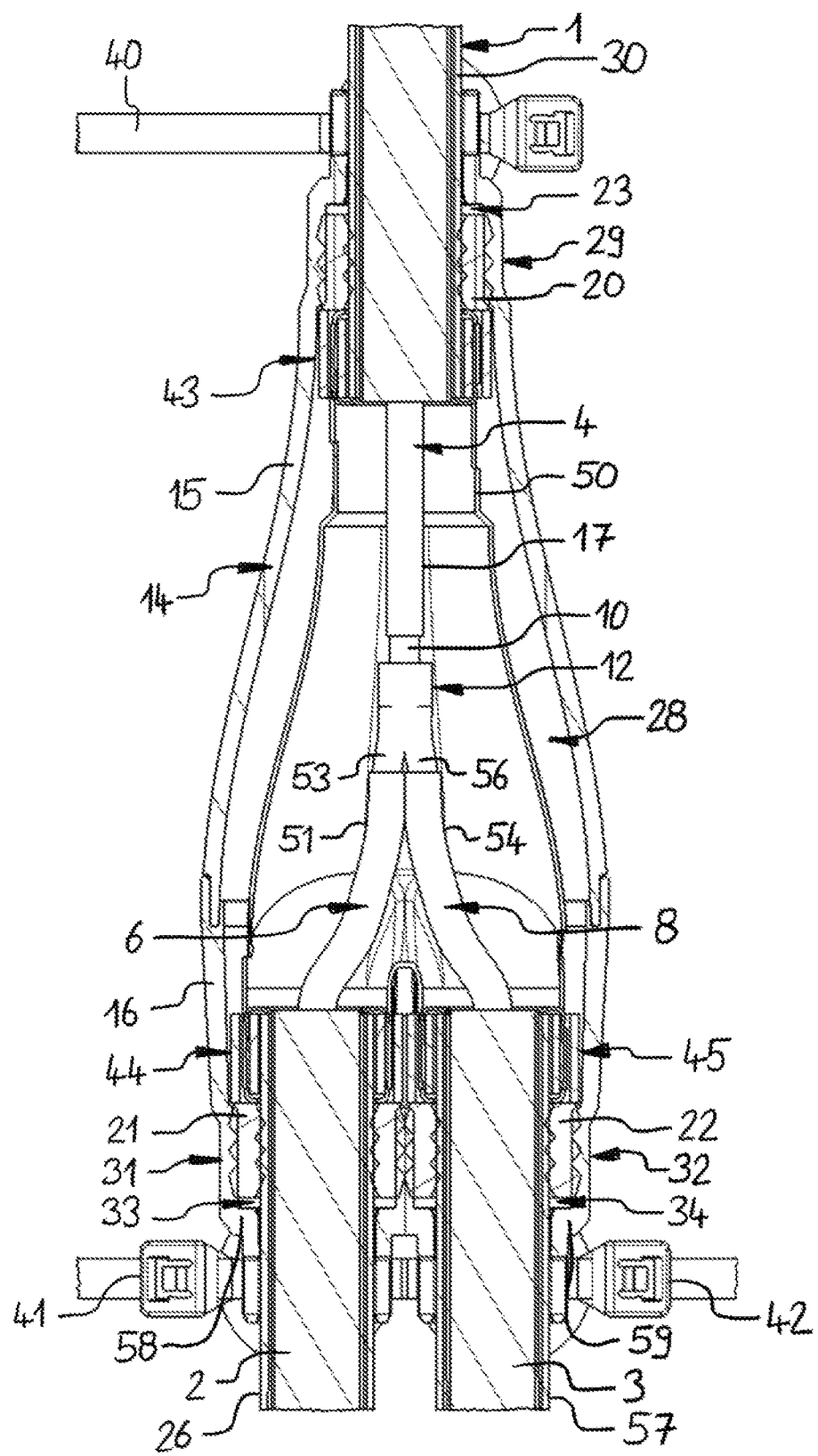
FIG. 4 is a longitudinal sectional top view of the splice sealing device according to FIG. 1.
Figure 5:
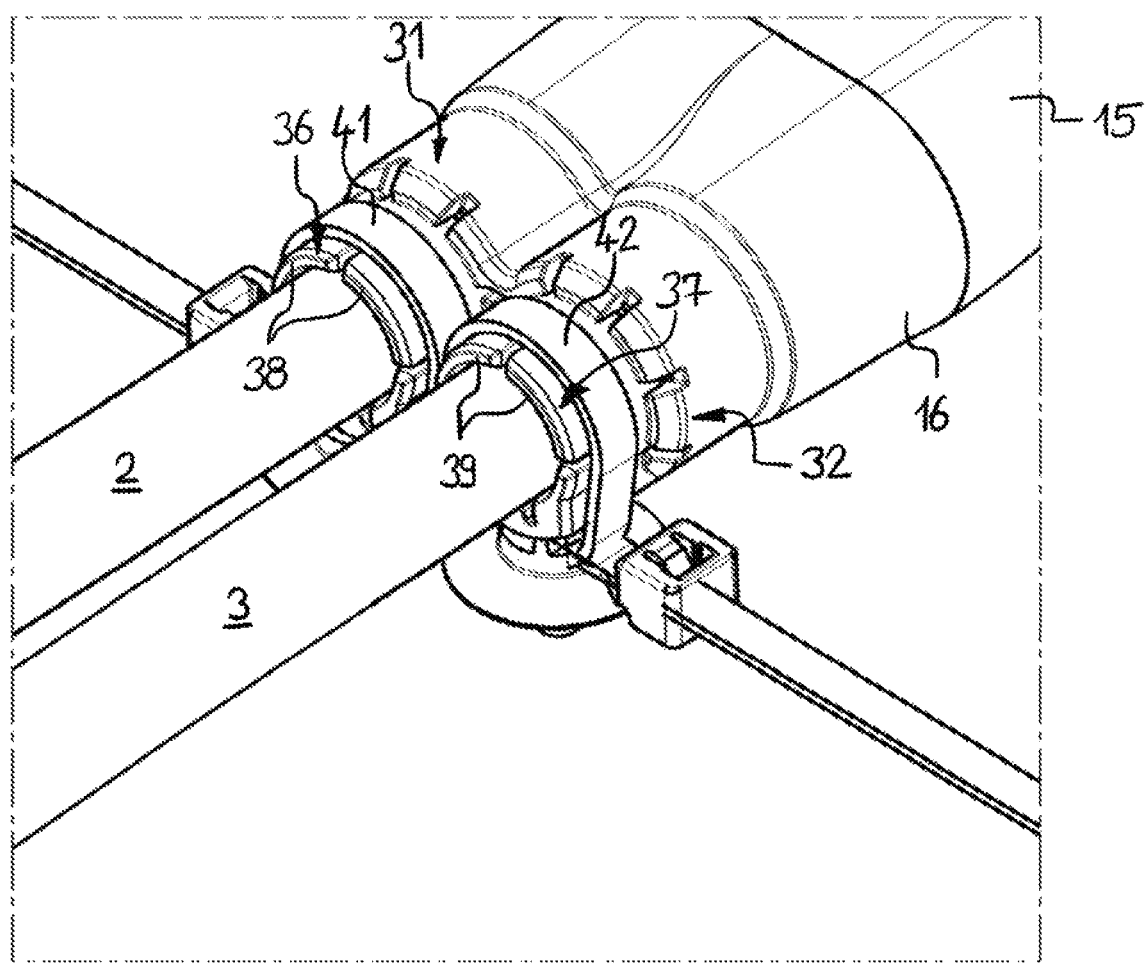
FIG. 5 is a partial perspective view of the splice sealing device according to FIG. 1.

FIG. 1 shows a perspective view of a splice sealing device to split a first cable 1 into multiple cables, i.e. a second cable 2 and a third cable 3. Any other configuration is also possible such as a splice sealing device for a splice connection between two cables or for a splice connection to split multiple cables into other multiple cables.

The cables 1, 2, 3 are electrically connected as described later wherein the connection is enclosed by a housing 14. The housing 14 comprises a first housing part 15 and a second housing part 16. The first housing part 15 has a first cable exit 29 in the form of a single cable exit for the first cable 1. The second housing part 16 has two cable exits, i.e. a second cable exit 31 and third cable exit 32, both in the form of a single cable exit for guiding the second cable 2 and the third cable 3 there through, respectively. It is also conceivable that one of the housing parts 15, 16 may have more as the described cable exits. It is also possible that one or more of the cable exits are provided in the form of multiple cable exits which means that through one cable exit multiple cables exit the housing. In such a case there is per each cable exit one cable seal through which multiple cables are lead so that one cable seal seals more than one cable.

FIGS. 2 to 5 disclose different views of a splice sealing device and are described together hereinafter.

The first cable 1 has a first wire 4 and a second wire 5. The second cable 2 and the third cable 3 are configured identical to the first cable 1. That means, that the second cable 2 has a first wire 6 and a second wire 7 and the third cable 3 has a first wire 8 and a second wire 9. In the disclosed embodiment, all wires 4, 5, 6, 7, 8, 9 are configured identical to each other. However, the wires 4, 5, 6, 7, 8, 9 can also differ from each other, for example with respect to the wire materials and dimensions.

The first wire 4 of the first cable 1 has a first conductor 10 which is covered by a first wire insulation 17. The second wire 5 of the first cable 1 has a second conductor 11 which is covered by a second wire insulation 18. The first wire insulation 17 of the first cable 1 and the second wire insulation 18 of the first cable 1 are both stripped off at free ends of the respective first and second wires 4, 5 of the first cable 1 so that the first conductor 10 and the second conductor 11 of the first cable 1 are exposed.

The first wire 6 of the second cable 2 has a first conductor 53 which is covered by a first wire insulation 51 and the second wire 7 of the second cable 2 has a second conductor which is covered by a second wire insulation 52. The first wire insulation 51 of the second cable 2 and the second wire insulation 52 of the second cable 2 are both stripped off at free ends of the respective first and second wires 6, 7 of the second cable 2 so that the first conductor 53 and the second conductor of the second cable 2 are exposed.

The first wire 8 of the third cable 3 has a first conductor 56 which is covered by a first wire insulation 54 and the second wire 9 of the third cable 3 has a second conductor which is covered by a second wire insulation 55. The first wire insulation 54 of the third wire 3 and the second wire insulation 55 of the third cable 3 are both stripped off at free ends of the respective first and second wires 8, 9 of the third cable 3 so that the first conductor 56 and the second conductor of the third cable 3 are exposed.

The first conductors 10, 53, 56 of the respective first wires 4, 6, 8 are electrically connected to each other at a first junction 12 for example by ultrasonic welding or another well-known method for connecting conductors. Comparable to this, the second conductors 11 of the second wires 5, 7, 9 are electrically connected to each other at a second junction 13, also for example by ultrasonic welding or another well-known method for connecting conductors. The first wires 4, 6, 8 form a first electrical conduit and the second wires 5, 7, 9 form a second electrical conduit.

In principle, it is also conceivable that each cable has just one wire or more than two wires.

The junctions 12, 13 are enclosed by the housing 14. The housing 14 comprises the integral first housing part 15 and the integral second housing part 16. In this context "integral" means that the housing parts 15, 16 are each made of one piece as an integral part. The first housing part 15 and the second housing part 16 are mated together to form the housing 14.

The first housing part 15 as a first cable exit 29 for the first cable 1. The first cable exit 29 is an integral part of the first housing part 15 which means that it is only part of the first housing part 15 and is not a part of the second housing part 16.

At the first cable exit 29 the first housing part 15 comprises a first chamber 23 accommodating a first cable seal 20. The first cable seal 20 is sealingly positioned on a first insulative cover 30 of the first cable 1. The first insulative cover 30 of the first cable 1 encloses the first wire 4 and the second wire 5 of the first cable 1. The first cable exit 29 has an annular wall 24 axially delimiting the first chamber 23 to the outside and being able to support the first cable seal 20 in an axial direction parallel to the extension direction of the first cable 1 along a longitudinal axis L of the first cable 1. In case that the first cable 1 has just one single wire, the first insulative cover 30 may be the wire insulation of the single wire.

The first cable exit 29 comprises a passage channel 25. The first cable 1 extends through the passage channel 25 and through the first chamber 23 so that the first cable 1 exits the housing 14 through the first cable exit 29.

The inner diameter of the first passage channel 25 is smaller than the inner diameter of the first chamber 23 wherein between a circumferential inner sealing face 27 of the first chamber 23 and the first insulative cover 30 of the first cable 1 there is formed a radial space in which the first cable seal 20 is accommodated. The first cable seal 20 is in sealing contact with the sealing face 27 of the first chamber 23 and with the first insulative cover 30. Thereby, the first cable 1 is sealed against the first housing part 15. The first chamber 23 opens into an inner space 28 of the housing 14. In said inner space 24 the junctions 12, 13 are located.

The second housing part 16 has a second cable exit 31 for the second cable 2 and a third cable exit 32 for the third cable 3. The second cable exit 31 and the third cable exit 32 are configured according to the first cable exit 29. That means, that the second cable exit 31 has second chamber 33 for a second cable seal 21 and the third cable exit 32 has third chamber 34 for a third cable seal 22. The second cable seal 21 is in sealing contact to a second insulative cover 26 of the second cable 2 and third cable seal 22 is in sealing contact to a third insulative cover 57 of the third cable 3. Further, the second cable exit 31 has an annular wall 58 axially delimiting the second chamber 33 to the outside and being able to support the second cable seal 21 and the third cable exit 32 has an annular wall 59 axially delimiting the third chamber 34 to the outside and being able to support the third cable seal 22. In regard to the configuration of the second cable exit 31 and the third cable exit 32 it is also referred to the description of the first cable exit 29.

The first housing part 15 has a first sleeve portion 35 in the area of the first cable exit 29. The first sleeve portion 35 forms the passage channel 25 of the first passage opening 25. The first sleeve portion 35 is accommodated on the first insulative cover 30 of the first cable 1.

Comparable to the first sleeve portion 35 the second housing part 16 has a second sleeve portion 36 and a third sleeve portion 37. The second sleeve portion 36 and the third sleeve portion 37 each have a plurality of clamping arms 38, 39 which extend from the second housing part 16 in a direction away from the respective chamber 33, 34 and which are flexible in a radial direction towards to and away from the respective cable 2, 3, as can best be seen in FIG. 5. The clamping arms 38, 39 can be configured such that they are held with a pre-clamping force against the insulative covers 26, 57 of the respective cables 2, 3.

For a reliable fixation of the housing 14 on the cables 1, 2, 3 the splice sealing device further comprises cable straps 40, 41, 42 which are wound around the sleeve portions 35, 36, 37. The cable straps 40, 41, 42 are tightened so that the sleeve portions 35, 36, 37 are clamped onto the respective cable 1, 2, 3.

The splice sealing device further comprises a shielding case comprising two shield halves 49, 50 in order to provide an electromagnetic shielding of the splice sealing device. The shielding halves 49, 50 enclose the junctions 12, 13 and the exposed wires 4, 5, 6, 7, 8, 9 which are led out of the insulative covers 26, 30, 57 of the cables 1, 2, 3.

Each cable 1, 2, 3 further has a contact sleeve arrangement 43, 44, 45. In the disclosed embodiment the contact sleeve arrangements 43, 44, 45 are configured identical and the first contact sleeve arrangement 43 of the three contact sleeve arrangements 43, 44, 45 is described hereinafter in representation for all other contact sleeve arrangements 44, 45.

The first contact sleeve arrangement 43 is mounted onto the first insulative cover 30 of the first cable 1. The first contact sleeve arrangement 43 has an inner sleeve 46 positioned on the first insulative cover 30 of the first cable 1. The first contact sleeve arrangement 43 further comprises an outer sleeve 47 arranged around the inner sleeve 46. The outer sleeve 47 is also arranged around a contact portion 19 of the shielding case wherein the contact portion 19 is arranged around the inner sleeve 46. The contact portion 19 has a cylindrical form and is formed by both shielding halves 49, 50. The outer sleeve 47 holds the shielding halves 49, 50 together at the contact portion 19.

The first cable 1, as also the second cable 2 and the third cable 3, are shielded and has a shielding 48. The shielding halves 49, 50 are made of a conductive material and are electrically connected to the shielding 48 of the first cable. For this reason the inner sleeve 46 and the outer sleeve 47 are also made from a conductive material. The shielding 48 is led out of the insulative cover 30 and folded back over the inner sleeve 46. The contact portion 19 of the shielding case is arranged around the inner sleeve 46 and the shielding 48 thereby electrically connecting the shielding halves 49, 50 to the shielding 48. The second contact sleeve arrangement 44 and the third contact sleeve arrangement 45 are both, as mentioned above, designed in the same manner so that the shielding case electrically connects all shielding of the cables 1, 2, 3.

The contact sleeve arrangements 43, 44, 45 are located on the opposite side of the annular walls 24 of the respective chamber 23, 33, 34. Hence, each cable seal 20, 21, 22 is arranged between the respective annular wall 24 and the contact sleeve arrangements 43, 44, 45 so that the seals 20, 21, 22 are held securely held within the respective chamber 23, 33, 34.

The junctions 12, 13 are provided with an electrical insulation electrically insulating the two junctions 12, 13 from each other.

When assembling the splice sealing device first the insulative cover 26, 30, 57 of the cables 1, 2, 3 are stripped off at free ends of the cables 1, 2, 3 exposing the first wires 4, 6, 8 and the second wires 5, 7, 9. Further, the wire insulations 17, 18, 51, 52, 54, 55 are stripped off the wires 4, 5, 6, 7, 8, 9 at the free ends thereof exposing the conductors 10, 11, 53, 56. The first cable 1 is led through the passage channel 26 of the first cable exit 29 of the first housing part 15. The first housing part 15 is arranged in such an orientation that the part of the first housing part 15 which forms the later inner space 28 of the housing 14 faces the exposed wires 4, 5 of the first cable 1.

In the same manner the second cable 2 and the third cable 3 are led through the passage openings of the second cable exit 31 and the third cable exit 32, respectively. Afterwards, the first cable seal 20 is slid onto the first insulative cover 30 of the first cable 1. In the same manner the second cable seal 21 is slid onto the second insulative cover 26 of the second cable 2 and the third cable seal 22 is slid onto the third insulative cover 57 of the third cable 3. After the cable seals 20, 21, 22 have been mounted onto the cables 1, 2, 3 the inner sleeve 46 are mounted onto the cables 1, 2, 3, too. The shieldings 48 of the cables 1, 2, 3 are folded back over the inner sleeves 46. Then the contact portions 19 of the shielding halves 49, 50 are arranged on the folded back shieldings 48 establishing an electrical connection between the shieldings 48 and the shielding case (formed by the shielding halves 49, 50). In order to hold the shielding halves 49, 50 the outer sleeves are 47 are mounted onto the contact portions 19.

The first housing part 15 and the second housing part 16 are mated by moving the first housing part 15 and the second housing part 16 towards each other. By this movement the cable seals 20, 21, 22 are moved into the respective chamber 23, 33, 34 and are further pushed by the respective annular wall 24 on the insulative cover 26, 30, 57 of the respective cable 1, 2, 3 to their final position. The housing parts 15, 16 are connected to each other by laser welding or any other suitable well known connection method in order to close the inner space 28.

In principle, it is also possible that cables are used without a shielding.

What is claimed is:

1. A Splice sealing device comprising:
   a first electric cable having an electrical conductor and an insulative cover enclosing the electrical conductor of the first electric cable;
   a second electric cable having a further electrical conductor and further insulative cover enclosing the electrical conductor of the second electric cable;
   a junction joining the electrical conductor of the first electric cable and the electrical conductor of the second electric cable;
   a housing which has at least a first housing part and a second housing part mated to each other, said housing delimits an inner space for accommodating the junction; and
   a first cable exit being an integral part of the first housing part wherein the first cable extends through the first cable exit and
   wherein the first cable exit comprises a first chamber accommodating a first cable seal sealingly positioned on the first insulative cover of the first cable and sealing the first cable against the housing;
   a second cable exit being an integral part of the second housing part wherein the second cable extends through the second cable exit and wherein the second cable exit comprises a second chamber accommodating a second cable seal sealingly positioned on the second insulative cover of the second cable and sealing the second cable against the housing;
   wherein the first cable exit comprises an annular wall axially delimiting the first chamber to the outside in extension direction of the first cable; and
   wherein the second cable exit comprises an annular wall axially delimiting the second chamber to the outside in extension direction of the second cable.

2. The splice sealing device of claim 1,
   wherein the first chamber has a circumferential sealing face, and the first cable seal is in sealing contact to said sealing face.

3. The splice sealing device of claim 1,
   wherein the first cable exit has a first sleeve portion mounted onto the insulative cover of the first cable; and
   wherein a passage channel for the first cable extends through the first sleeve portion.

4. The splice sealing device of claim 3,
   wherein the passage channel extends through the annular wall of the first cable exit and opens into the first chamber.

5. The splice sealing device of claim 3,
   wherein the first sleeve portion has clamping arms extending in a direction away from the first chamber and distributed around the first cable, wherein said clamping arms are radially biased towards the first cable.

6. The splice sealing device of claim 3,
   wherein a first contact sleeve arrangement comprises an inner sleeve positioned between the insulative cover of the first cable and the shielding of the first cable;
   wherein the shielding case comprises a contact portion positioned on the shielding of the first cable; and
   wherein the first contact sleeve arrangement further comprises an outer sleeve positioned onto the contact portion of the shielding case.

7. The splice sealing device of claim 1,
   wherein a shielding case is arranged within the housing enclosing the junction;
   wherein a first contact sleeve arrangement is mounted on the insulative cover of the first cable;
   wherein the first contact sleeve arrangement is in electrical contact to a shielding of the first cable and to the shielding case; and
   wherein the first contact sleeve arrangement delimits the first chamber in axial direction opposite the annular wall of the first cable exit.

8. The splice sealing device of claim 1,
   wherein the housing has a third cable exit being an integral part of a second housing part of the at least two housing parts;
   wherein a third cable extends through the third cable exit;
   wherein the third cable exit comprises a third chamber accommodating a third cable seal sealingly positioned on the third insulative cover of the third cable and sealing the third cable against the housing; and
   wherein the third cable exit comprises an annular wall axially delimiting the third chamber to the outside in extension direction of the third cable.

* * * * *